(12) United States Patent
Butov

(10) Patent No.: US 7,825,402 B2
(45) Date of Patent: Nov. 2, 2010

(54) EXCITONIC SIGNAL PROCESSING OPTICALLY INTERFACED ELECTRICALLY CONTROLLED DEVICES

(75) Inventor: Leonid Butov, Encinitas, CA (US)

(73) Assignee: The Regents of the University of California, Oakland, CA (US)

(*) Notice: Subject to any disclaimer, the term of this patent is extended or adjusted under 35 U.S.C. 154(b) by 0 days.

(21) Appl. No.: 12/293,909

(22) PCT Filed: Oct. 31, 2006

(86) PCT No.: PCT/US2006/042555

§ 371 (c)(1),
(2), (4) Date: Dec. 16, 2008

(87) PCT Pub. No.: WO2007/126418

PCT Pub. Date: Nov. 8, 2007

(65) Prior Publication Data

US 2009/0101889 A1    Apr. 23, 2009

Related U.S. Application Data

(60) Provisional application No. 60/786,314, filed on Mar. 27, 2006.

(51) Int. Cl.
*G02F 1/01* (2006.01)
(52) U.S. Cl. .................. 257/24; 257/E29.168; 250/225
(58) Field of Classification Search .................... 257/24, 257/225, E29.168
See application file for complete search history.

(56) References Cited

U.S. PATENT DOCUMENTS 4,872,744 A   10/1989   Abeles et al.
4,884,119 A   11/1989   Miller
5,306,925 A *  4/1994   Abe et al. ...................... 257/21
5,329,136 A *  7/1994   Goossen ....................... 257/17
6,841,795 B2 *  1/2005   Taylor et al. .................. 257/14

OTHER PUBLICATIONS

L.V. Butov, "Condensation of and pattern formation in cold exciton gases in coupled quantum wells", *J. Phys.: Condens. Matter*, vol. 16, pp. R1577-R1613 (2004).

L.V. Butov, L.S. Levitov, A.V. Mintsev, B.D. Simons, A.C. Gossard, and D.S. Chemla, "Formation Mechanism & Low-Temperature Instability of Excitation Rings", *Phys. Rev. Lett.*, vol. 92, pp. 117404-1-117404-4 (2004).

(Continued)

*Primary Examiner*—Bradley K Smith
*Assistant Examiner*—Jami M Valentine
(74) *Attorney, Agent, or Firm*—Greer, Burns & Crain Ltd.

(57) ABSTRACT

The present invention presents devices and methods for localized control and transport of excitons as well as separate processing of holes and electrons in a device with an optical input and an optical output. An example optoelectronic device includes a coupled or wide quantum well structure. Optical input and optical output electrodes are arranged over regions that are separated by a gate electrode region. The coupled or wide quantum well structure is dimensioned and formed from materials that create a nonzero distance d between the separated electron and hole of an excitors formed in response to the input. The flow of excitons (separated electrons and holes) between the optical input and optical output can be controlled by a voltage potentials applied to the localized gate electrode, optical input, and output electrodes.

15 Claims, 6 Drawing Sheets

OTHER PUBLICATIONS

L.V. Butov, "Excitation Condensation Coupled Quantum Wells", *Solid State Communications*, vol. 127, pp. 89-98 (2003).

L.V. Butov, A.C. Gossard, and D.S. Chemla, "Macroscopically ordered state in an exciton system", *Nature*, vol. 418, p. 751 (Apr. 22, 2002).

L.V. Butov, C.W. Lai, AL. Ivanov, AC. Gossard, and D.S. Chemla, "Towards Base-Einstein Condensation of Excitons in Potential Traps", *Nature*, vol. 417, p. 47 (May 2, 2002).

L.V. Butov, C.W. Lai, D.S. Chemla, Yu.E. Lozovik, K.L. Campman, and A.C. Gossard, "Observation of Magnetically Induced Effective-Mass Enhancement of Quasi-2D Excitons", *Phys. Rev. Lett.* vol. 87, No. 21, pp. 216801-216804 (2001).

L.V. Butov, A.L. Ivanov, A Imamoglu, P.B. Littlewood, AA Shashkin, V.T. Dolgopolov, K.L. Campman, and AC. Gossard, "Stimulated scattering of indirect excitons in coupled quantum wells: Signature of a degenerate Bose-gas of excitons", *Phys. Rev. Lett.* vol. 86, No. 24, pp. 5608-5611 (Jun. 11, 2001).

L.V. Butov, A. Imamoglu, K.L. Campman, and AC. Gossard, "Coulomb Effects in Spatially Separated Electron and Hole Layers in Coupled Quantum Wells", *Journal of Experimental and Theoretical Physics*, vol. 92, No. 2, 2001, pp. 260-266.

L.V. Butov, A. Imamoglu, AA Shashkin, V.T. Dolgopolov, AV. Mintsev, S.G. Feklisov, K.L. Campman, and AC. Gossard, "Magneto-optics of the spatially separated electron and hole layers in GaAs/AlGaAs coupled quantum wells", *Physica E*, vol. 6, pp. 655-659 (2000).

L.V. Butov, A. Imamoglu, AA Shashkin, V.T. Dolgopolov, AV. Mintsev, S.G. Feklisov, K.L. Campman, and A. C. Gossard, "Nonlinear Photoluminescence Kinetics of Indirect Excitons in Coupled Quantum Wells", *Phys. Stat. Sol. a*, vol. 178, pp. 83-87 (2000). .

L.V. Butov, AV. Mintsev, Yu.E. Lozovik, K.L. Campman, and A.C. Gossard, "From Spatially Indirect Excitons to Momentum-Space Indirect Excitons by an In-Plane Magnetic Field", *Physical Review B*, vol. 62, No. 3, pp. 1548-1551 (2000).

L.V. Butov, A Imamoglu, AV. Mintsev, K.L. Campman, and A.C. Gossard, "Photoluminescence Kinetics of Indirect Excitons in GaAs/$Al_xGa_{l-x}As$ Coupled Quantum Wells", *Physical Review B*, vol. 59, No. 3, pp. 1625-1625, (Jan. 15, 1999).

L.V. Butov, AV. Mintsev, AI. Filin, and K. Eberl, "Kinetics of indirect photoluminescence in GaAs/AlxGal-x As Double Quantum Wells in a Random Potential with a Large Amplitude", *Journal of Experimental and Theoretical Physics*, vol. 88, No. 5, pp. 1036-1044 (May 1999).

L.V. Butov, A. Imamoglu, A.A Shashkin, V.T. Dolgopolov, A.V. Mintsev, S.G. Feklisov, K.L. Campman, and AC. Gossard, "Magneto-optics of the spatially separated Electron and Hole Layers in GaAs/AlGaAs Coupled Quantum Wells", *Physica E*, vol. 6, pp. 655-659 (2000).

L.V.Butov, A.I. Filin, "Anomalous Transport and Luminescence of Indirect Excitons in AlAs/GaAs coupled quantum wells as evidence for exciton condensation", *Phys. Rev. B*, vol. 58, No. 4, pp. 1980-2000 (Jul. 15, 1998).

L.V.Butov, A.I. Filin, Energy Relaxation and Transport of Indirect Excitons in AlAs/GaAs Coupled quantum wells in high magnetic fields, vol. 87, No. 3, pp. 608-611 (Sep. 1998).

L.V. Butov, A. Zrenner, G. Abstreiter, AV. Petinova, K. Eberl, "Direct and indirect magnetoexcitons in symmetric $In_xGa_{l-x}As$/GaAs coupled quantum wells", *Phys. Rev. B*, vol. 52, No. 16, pp. 12153-12157 (Oct. 15, 1995).

L.V. Butov, A. Zrenner, G. Abstreiter, G. Bohm, G. Weimann, "Condensation of Indirect Excitons in Coupled AlAs/GaAs Quantum Wells", *Phys. Rev. Lett.*. vol. 73, No. 2, pp. 304-307 (Jul. 11, 1994).

L.V. Butov, A. Zrenner, G. Bohm, G. Weimann, "Condensation of indirect excitons in coupled AlAs/GaAs quantum wells", *Journal de Physique IV*, vol. 3, pp. 167-170 (Oct. 1993).

L.V. Butov, V.D. Kulakovskii, "Spin-splitting renormalization in the neutral dense magnetoplasma in $In_xGa_{l-x}As$/InP quantum wells", *Physical Review B*, vol. 48, No. 24, pp. 17933-17937 (Dec. 15, 1993).

L.V. Butov, V.D. Kulakovskii, G.E.W. Bauer, A. Forchel, D. Grutzmacher, "Excitons in dense two-dimensional electron-hole magnetoplasmas", *Physical Review B*, vol. 46, No. 19, pp. 12765-12768 (Nov. 15, 1992).

L.V. Butov, V.D. Kulakovskii, E.I. Rashba, "Excitations and deexcitons in a neutral 2D magnetoplasma with an integer filling of Landau levels: experiment and theory", *JTEP Lett.*, vol. 53, No. 2, pp. 109-115 (Jan. 25, 1991).

A.T. Hammack, M. Griswold, L.V. Butov, L.E. Smallwood, A.L. Ivanov, and A.C. Gossard, "Trapping of Cold Excitons in. Quantum Well Structures with Laser Light", *Physical Review Letters*, vol. 96, pp. 227402-1-4 (Jun. 9, 2006).

A.T. Hammack, N.A. Gippius, Sen Yang, G.O. Andreev, L.V. Butov, M. Hanson, and A.C. Gossard, "Excitons in Electrostatic Traps", *Journal of Applied Physics*, vol. 99, pp. 066104-1-3 (2006).

R. Tyler Hillman, "Researchers Get Unexpected Results with Chilling Efforts" *The Daily Californian*, Sep. 4, 2002.

A.L. Ivanov, L.E. Smallwood, A.T. Hammack, S. Yang, L.V. Butov, A.C. Gossard, "Origin of the inner ring in photoluminescence patterns of quantum well excitons", *Europhysics Letters*, vol. 73, No. 6, pp. 920-926 (2006).

L.S. Levitov, B.D. Simons, and L.V. Butov, "Pattern formation as a signature of quantum degeneracy in a Cold Exciton System", Physical Review Letters, vol. 94, pp. 176404-1-4 (Jun. 5, 2005).

Yu E. Lozovik, LV. Ovchinnikov, S. Yu Volkov, L.V. Butov, and D.S. Chemla, "Quasi-two-dimensional excitons in finite magnetic fields", *Physical Review B*, vol. 65, pp. 235304-1-11 (2002).

Murray Holland,, "Condensates on crest of a wave", *Physics World*, vol. 15 No. 7,p. 19 (Jul. 2002).

Ilias E. Perakis, "Condensed-Matter Physics: Exciton Developments" *Nature*, vol. 417, pp. 33-34 (May 2, 2002).

Lynn Yarris, "An Exciting new State for Excitons", *Berkeley Lab Research News*, (Aug. 22, 2002).

G. Grosso et al., "Excitonic Switches Operating at Around 100K", *Letters*, Sep. 27, 2009, pp. 577-580.

Alex A. High et al., "Control of Exciton Fluxes in an Excitonic Integrated Circuit", *Science Magazine*, vol. 321, Jul. 11, 2008, pp. 229-231.

A.A. High et al., "Exciton Optoelectronic Transistor", vol. 32, No. 17, Sep. 1, 2007, pp. 2466-2468.

\* cited by examiner

EXCITONIC SIGNAL PROCESSING OPTICALLY INTERFACED ELECTRICALLY CONTROLLED DEVICES

PRIORITY CLAIM

Applicants claim priority benefits under 35 U.S.C. §119 on the basis of Patent Application No. 60/786,314, filed Mar. 27, 2006.

FIELD OF THE INVENTION

A field of the invention is opto-electronics, and particularly excitonic signal processing.

BACKGROUND

Conventional integrated electronics make use of electrical charge to produce electronic signal processing. Gates control electrical carriers, i.e., holes or electrons in semiconductor devices. Semiconductor devices remain the basis for electronics devices.

Optoelectronic circuits offer the opportunity to make use of the speed of optical signal communication. Optical communications are also less likely to be influenced by interference than electrical signal communications. Typically, optoelectronics finds use in signal communication, such as in optical fiber networks. Optical communications are also used, for example, to communicate information between devices, such as optical communications used in providing audio signals between components in home theatre systems. In conventional optoelectronic devices and systems, interconnects between electronic circuits and optical transceivers are required. Optical signals are not directly processed, but instead are produced when the electrical signals are converted and vice versa.

Conventional optoelectronic devices are based upon a mutual relation between optical absorption or emission and photocurrent or electric field. This is used in some devices to create electrical current in response to absorbed photons, e.g., in photo sensors. This is also the basis for emission of photons in response to applied energy, which is the basis for semiconductor lasers, light emitting diodes and other devices.

An exciton is a bound state of an electron and a hole, it is, a Coulomb correlated electron-hole pair. An exciton can be formed in a semiconductor when a photon is absorbed. Lifetimes and energy of excitons has been an area of research for a significant time both in quantum well and bulk semiconductor materials.

Coupled quantum well structures have been used to realize indirect excitons composed of electros and holes in separated layers. Lifetimes and energies of excitons in coupled quantum well structures can be controlled, for example, by the application of an electric field. A review of the past work on excitons in coupled quantum wells including the studies of lifetimes and energies of excitons can be found in "Condensation and Pattern Formation in Cold Exciton Gases in Coupled Quantum Wells", L.V. Butov, J. Phys.: Condens. Matter 16 (2004) R1577-R1613.

The present inventor has previously demonstrated control of indirect exciton energy and overlap between the electron and hole wave functions, which results to change of the absorption and emission rate, by applying voltage to a gate over the entire area of the coupled quantum well planar semiconductor structure. The exciton and electron spin relaxation rates were predicted to be determined by the overlap between the electron and hole wave functions in M. Z. Maialle, E. A. de Andrada e Silva, and L. J. Sham, Phys. Rev. B 47, 15776 (1993). As an example, a change of the exciton-emission rate by about $10^4$ times, which should result to a change of the time of exciton spin flip between optically active spin states by $10^8$ times, as well as a change of the exciton energy by about 40 meV at gate voltage V=1.6 V were demonstrated in Butov et al., "Photoluminescence Kinetics of Indirect Excitons in GaAs/AlGaAs Coupled Quantum Wells," Phys. Rev. B 59, 1625 (1999).

The electric field in the z direction has been controlled by an external gate voltage $V_g$ applied over an area of the semiconductor materials including a coupled quantum well. At low $V_g$ (direct regime), the spatially direct exciton is the lowest energy state, while at high $V_g$ (indirect regime) the indirect exciton composed of electron and hole in different layers is the lowest energy state. The transition from the direct to the indirect regimes is determined by the ratio between the one-particle symmetric-antisymmetric splittings and the exciton binding energies. For a given coupled quantum well sample, this ratio and the direct-to-indirect crossover can be controlled by magnetic fields. See, Butov, et al. "Direct and indirect magnetoexcitons in symmetric InGaAs/GaAs coupled quantum wells," Phys. Rev. B 52, 12153 (1995). Butov, et al, "Magneto-optics of the spatially separated electron and hole layers in GaAs/AlGaAs coupled quantum wells," Phys. Rev. B 60, 8753 (1999).

SUMMARY OF THE INVENTION

The present invention presents devices and methods for localized control of transport of excitons as well as separate processing of holes and electrons in a device with an optical input ad an optical output. In an embodiment of the invention, an optoelectronic device includes a coupled or wide intrinsic quantum well structure. A localized gate electrode is arranged over a region of the coupled or wide quantum well structure. A optical input and optical output are arranged over other regions of the coupled or wide quantum well structure that are separated by the gate region. The coupled or wide single quantum well structure is dimensioned and formed from materials that create excitons with a nonzero distance d between the separated electron and hole of an exciton formed in response to the input. The flow of excitons (separated electrons and holes) between the optical input and optical output can be controlled by voltage potentials applied to the localized gate electrode, optical input, and output electrodes. An embodiment of the invention is an optoelectronic transistor.

In a method of the invention, photons are absorbed at an input of the optoelectronic device to photo excite electrons and holes and create excitons. A local energy barrier is created with an electric field to control exciton flow. A voltage pulse can be applied to an output of the device, increasing exciton recombination to facilitate conversion of excitons to photons producing an optical readout. Methods and devices of the invention permit the processing of excitions with separated electrons and holes followed by their subsequent recombination to produce a light output.

Another embodiment of the invention is an exciton opto-spin-electronic field effect transistor. The optoelectronic transistor includes an optical input and an optical output. Polarized photons are absorbed at an input of device creating spin-polarized excitons. Spin-polarized excitons travel to the optical output under control of a gate voltage. The gate voltage controls the spin flux. A voltage pulse can be applied to the output of the device, increasing exciton recombination rate to facilitate conversion of the exciton spin state to the photon polarization producing an optical readout of the exciton spin state at the optical output.

INVENTION DESCRIPTION

Figure 1A:
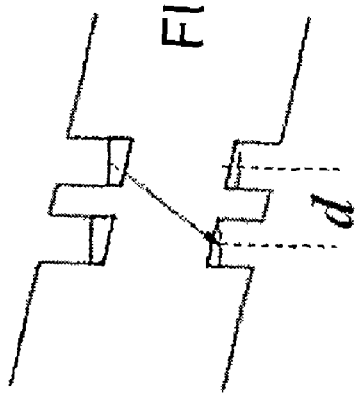
FIGS. 1A and 1B illustrate band diagrams of gated intrinsic quantum well semiconductor devices of the invention.

The present invention presents devices and methods for localized control and transport of excitons as well as separate processing of holes and electrons in a device with an optical input and an optical output. In an embodiment of the invention, an optoelectronic device includes a coupled or wide intrinsic quantum well structure. A localized gate electrode is arranged over a region of the coupled or wide quantum well structure. A optical input and optical output are arranged over other regions of the coupled or wide quantum well structure that are separated by the gate region. The coupled or wide quantum well structure is dimensioned and formed from materials that create excitons with a nonzero distance d between the separated electron and hole of an exciton formed in response to the input. The flow of excitons (separated electrons and holes) between the optical input and optical output can be controlled by voltage potentials applied to the localized gate electrode, optical input, and output electrodes. An embodiment of the invention is an optoelectronic transistor.

In a method of the invention, photons are absorbed at an input of the optoelectronic device to photo excite electrons and holes and create excitons. A local energy barrier is created with an electric to control exciton flow. A voltage pulse can be applied to an output of the device, increasing exciton recombination to facilitate conversion of excitons to photons producing an optical readout. Methods and devices of the invention permit the processing of excitons with separated electrons and holes followed by their subsequent recombination to produce a light output.

In preferred devices of the invention, light input is accepted and processed light output is produced. The device achieves local control of exciton or e-h fluxes and recombination by gates electrodes.

Another embodiment of the invention is an exciton opto-spin-electronic field effect transistor. The optoelectronic transistor includes an optical input and an optical output. Polarized photons are absorbed at an input of the device creating spin-polarized excitons. Spin-polarized excitons travel to the optical output under control of a gate voltage. The gate voltage controls the spin flux. A voltage pulse can be applied to the device, increasing exciton recombination rate to facilitate conversion the exciton spin state to the photon polarization producing an optical readout of the exciton spin state at the optical output.

Embodiments of the invention provide optoelectronic circuits that unify signal processing and optical communications. Preferred embodiment circuits are fully integrated in a chip and excitonic signal processing is directly coupled to optical inputs and outputs. Preferred embodiment monolithically integrated excitonic optoelectronic circuits are scalable and allow parallel processing with many optical inputs and outputs.

Embodiments of the invention provide methods of in-plane carrier separation through a laterally modulated gate voltage for integrated optoelectronic circuits. Preferred embodiment methods allow matching integrated electronic circuits with optical inputs and outputs without interconnects. Methods and devices of the invention permit scalable monolithically integrated optoelectronic circuits with parallel processing and many optical inputs and outputs.

Embodiments of the invention include electron-hole optoelectronic integrated circuits that accepts photons as input, creating electron-hole pairs in the material. The electron-hole pairs are prevented from recombining by application of electric fields, enabling the processing of the electrons and holes separately through traditional logic. After the processing, electric fields are removed to permit the electron-hole pair(s) to recombine, emitting photons that can then be routed via traditional optical communication channels. The preferred embodiment electron-hole optoelectronic integrated circuits can be integrated in a single IC chip that works in both the optical and electronic domains, reducing the form factor, cost and interconnect complexities of conventional two domain solutions.

Embodiments of the invention include an electron-hole optoelectronic transistor. The invention also includes an exciton optoelectronic transistor. The invention also provides electron-hole integrated optoelectronic circuits with optical inputs and outputs and signal processing using separated electrons and holes. The invention also provides excitonic integrated circuits with optical inputs and outputs and signal processing using excitons. The invention also provides methods of signal processing using electrons and holes. The invention also provides methods of excitonic signal processing. These can be regarded as methods of electronic operations on photons using electrons and holes as intermediate media, and methods of electronic operations on photons using excitons as intermediate media.

An exemplary embodiment of the invention is an electron-hole opto-spin-electronic field effect transistor. Another exemplary embodiment of the invention is an exciton opto-spin-electronic field effect transistor. Another exemplary embodiment of the invention is an integrated opto-spin-electronic circuit with polarized photons at inputs and outputs and signal processing using separated spin-oriented electrons and holes, referred to as an electron-hole opto-spin-electronic integrated circuit. Another exemplary embodiment of the invention is an integrated opto-spin-electronic circuit with polarized optical inputs and outputs and signal processing using excitons, referred to as an exciton opto-spin-electronic integrated circuit. The invention also provides methods of signal processing using spin-polarized electrons and holes. The invention also provides methods of signal processing using spin-polarized excitons. These can be regarded as methods of electronic operations on polarized photons using electrons and holes as intermediate media and methods of electronic operations on polarized photons using excitons as intermediate media.

Preferred embodiments will now be discussed with respect to the drawings, which may be presented schematically but will be fully understood by artisans with reference to the description. Broader aspects of the invention will be apparent to artisans from the detailed description.

Optoelectronic Devices with Excitons.

Figure 1B:
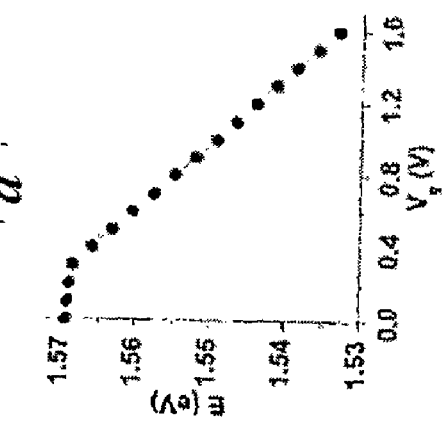

Optoelectronic devices of a first embodiment operate with indirect excitons in coupled or wide quantum wells structures. An indirect exciton is a bound pair of an electron and a hole separated in different intrinsic quantum wells or on opposite sides of an intrinsic quantum well by a nonzero distance d. FIGS. 1A and 1B illustrate band diagrams of gated quantum well semiconductor devices of the invention. In the example FIG. 1A device, AlAs and GaAs coupled intrinsic quantum wells are dimensioned to maintain an indirect exciton, with a bound hole and electron in the separate quantum well layers. In the example FIG. 1B device, two coupled intrinsic GaAs quantum wells are separated by a thin barrier layer, the wells and the barriers are dimensioned to maintain an indirect exciton, with a bound hole and electron in the separate quantum well layers.

Figure 1C:
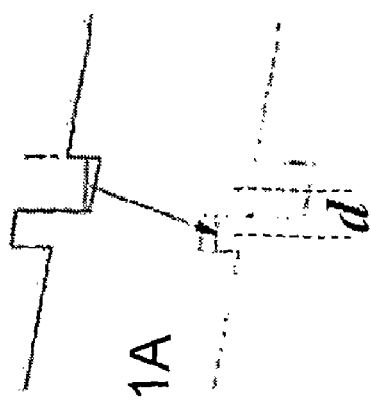
FIGS. 1C and 1D illustrate the control of indirect exciton energy by gate voltage respectively for the different devices of FIGS. 1A and 1B.
Figure 1D:
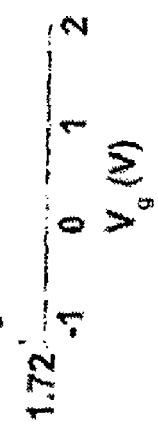
Figure 1E:
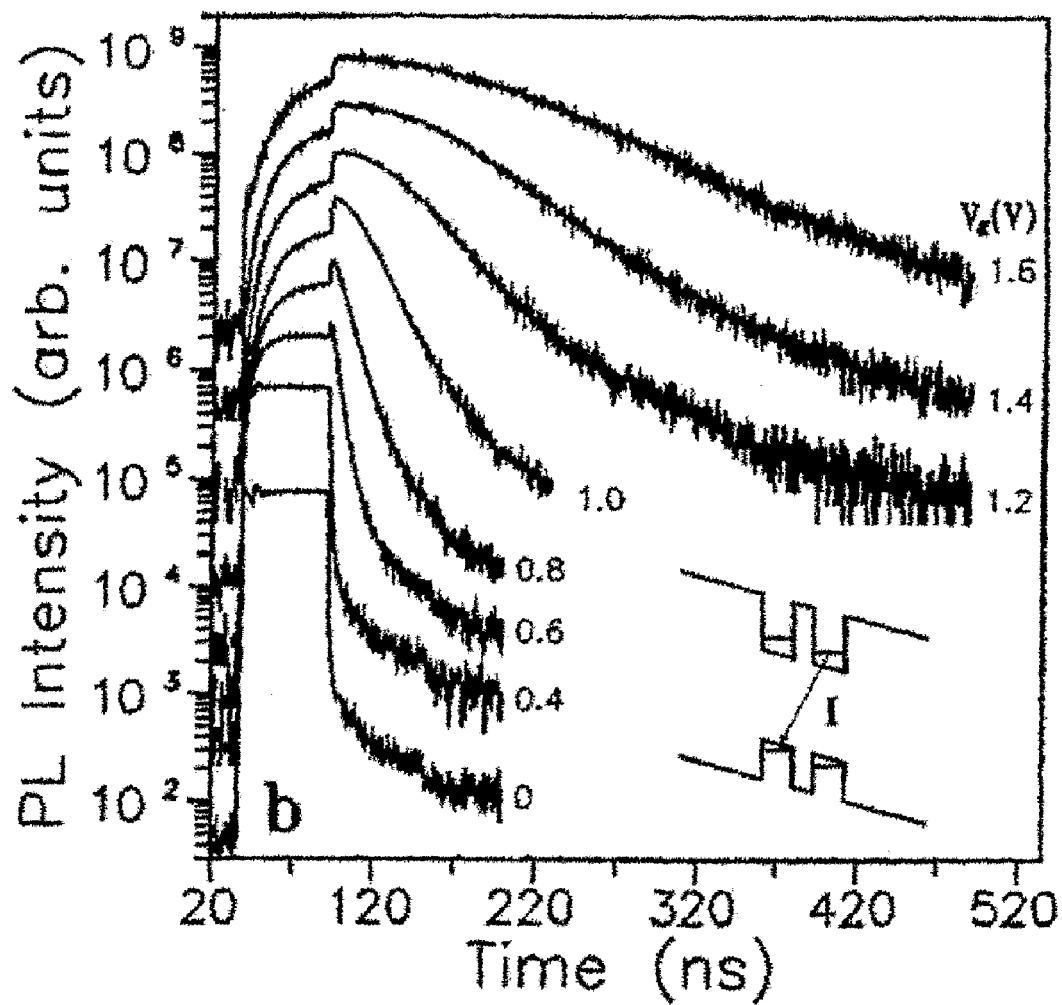
FIG. 1E illustrates control of the recombination rate of indirect excitons by gate voltage.

FIGS. 1C and 1D respectively illustrate control of indirect exciton energy by gate voltage for the devices having the FIGS. 1A and 1B band diagrams. FIG. 1E illustrates control of the recombination rate of indirect excitons by gate voltage.

The generation of an indirect exciton has been demonstrated in coupled quantum well structures. As an example, change of an exciton emission rate by $10^4$ times as well as change of the exciton energy by 40 meV at gate voltage V=1.6 V have been previously demonstrated. See, Butov, et al, "Photoluminescence Kinetics of Indirect Excitons in GaAs/AlGaAs Coupled Quantum Wells," Phys. Rev. B 59, 1625 (1999). The separation d between the electron and hole layers is achieved by an electric field in the structure growth direction and the electric field is controlled by applied gate voltage throughout the structure.

In the present invention, a localized gate electrode supplies electric field to provide signal processing. Signal processing in general electronic devices is based on electron energy control by gates. In devices of the invention, energy of indirect excitons is also controlled by a gate voltage: Applied gate voltage V leads to a linear shift of the indirect exciton energy $\delta E \sim Vd$ as shown in FIGS. 1C-1D. Therefore, for signal processing, indirect excitons can be used as well as electrons. In contrast to electrons, indirect excitons are optically active. They emit photons at recombination and absorb photons at photo excitation with the recombination rate and absorption coefficient being controlled electronically by gate voltage within several orders of magnitude. Thus, indirect excitons are both optically active and electronically controlled. Embodiments of the invention use this principle to provide integrated optoelectronic circuits with indirect excitons, i.e. excitonic circuits.

FIG. 2 illustrates a preferred embodiment gate controlled device of the invention, which can be referred to as an optoelectronic transistor. The device can process excitons, and can process separated holes and electrons. Transistor-like processing of excitons will be discussed first.

In these operations, an exciton flow is controlled between and optical input gate electrode 10 and an optical output gate electrode 12 by a control gate electrode 14. The region of the optical input gate electrode 10 can be considered an optical source, and the region of the optical output gate electrode 12—an optical drain. A quantum well structure 16 formed within intrinsic photonically responsive material, which may contain a single wide quantum well, coupled quantum wells, multiple quantum wells, or multiple coupled quantum wells, is separated from the gates 10-14 and a substrate 18, such as a conducting layer, by intrinsic semiconductor material 20. The substrate 18, which is a conducting layer, can be, for example: doped substrate, doped epitaxial semiconductor layer, or metal electrode.

The gates 10-14 are localized, being disposed over separate regions of the quantum well structure 16. The quantum well structure can have, for example, the materials and band structure of FIG. 1A or FIG. 1B.

In operation of the excitonic transistor of FIG. 2, excitons are photo excited in the source region of the optical input gate electrode 10 by photon absorption. Excitons travel to the drain region of the optical output gate electrode 12 where they transform into photons. Excitons can also arrive at the input from another excitonic device and can depart from the output to another excitonic device. The control gate electrode 14 controls an energy barrier for indirect excitons and, therefore, controls the exciton flow, thus realizing on or off state of the excitonic transistor. A voltage pulse can be applied to the optical output gate electrode 12 increasing the exciton recombination rate thus facilitating conversion of excitons to photons producing an optical readout in the drain region of the optical output gate. In preferred embodiments, the optical input gate electrode 10 and output gate electrode 12 are metals formed thin enough to be substantially transparent, or constitute a substantially transparent conductor, such as indium tin oxide. They can be also nontransparent; In this case optical input and output can be located between the gates 10 and 14 and 14 and 12, respectively.

The indirect excitons have very long lifetimes and can travel over distances exceeding hundred of microns before recombination, such as distances that are much larger than the size of the transistor device. Therefore indirect excitons can travel between optical input and optical output without substantial levels of recombination and most recombination can occur at the optical drain region of the optical output gate electrode 12. Also, in the FIG. 2 device, the excitors energy is a linear function of gate voltage.

A result of operation cycle of the FIG. 2 devices is that the intensity of light emitted at optical output is proportional to intensity of light at optical input and is controlled electronically by the control gate electrode 14. Transistor-like electronic operation is accomplished with photon input and output, using excitons as intermediate medium.

Excitonic Integrated Circuits

Instead of emitting photons from the top of the device as illustrated in FIG. 2, artisans will appreciate that waveguides can readily be integrated in the FIG. 2 structure in excitonic integrated circuits. Additionally, waveguide structures can be formed on top of individual transistor devices, to couple devices. Vertical and horizontal integrations can be achieved, as will be recognized by artisans.

Figure 3:
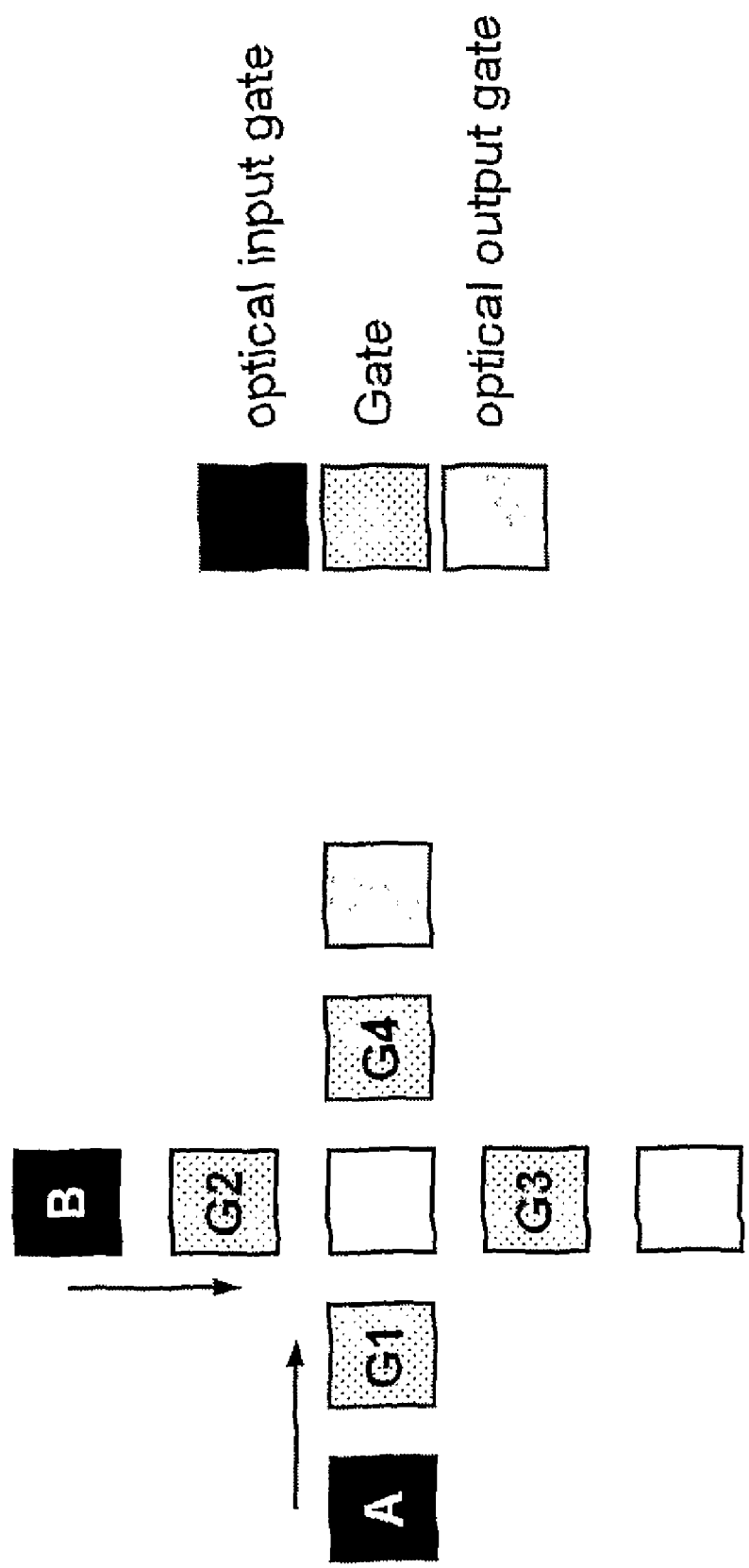
FIG. 3 schematically illustrates an example of integrated excitonic circuit of an embodiment of the invention, including an array of excitonic devices with a set of optical inputs, outputs, and gate electrodes.

FIG. 3 schematically illustrates an example of integrated circuit device of the invention, including a two dimensional array with many optical inputs and outputs and elaborated gate architecture form an exciton integrated circuit.

In FIG. 3, the integrated circuit has two optical inputs A and B and two optical outputs C and D, and implements electronic operations on photons including switching, sum operation, etc: The intensities of input and output lights are related as $C=a_1 A+b_1 B$ and $D=a_2 A+b_2 B$ with the coefficients $a_1$, $a_2$, $b_1$, and $b_2$ controlled electronically by the Gates G1-G4 via exciton flow control as illustrated with the individual device of FIG. 2.

Electron and Hole Processing

Figures 2A, 2B:
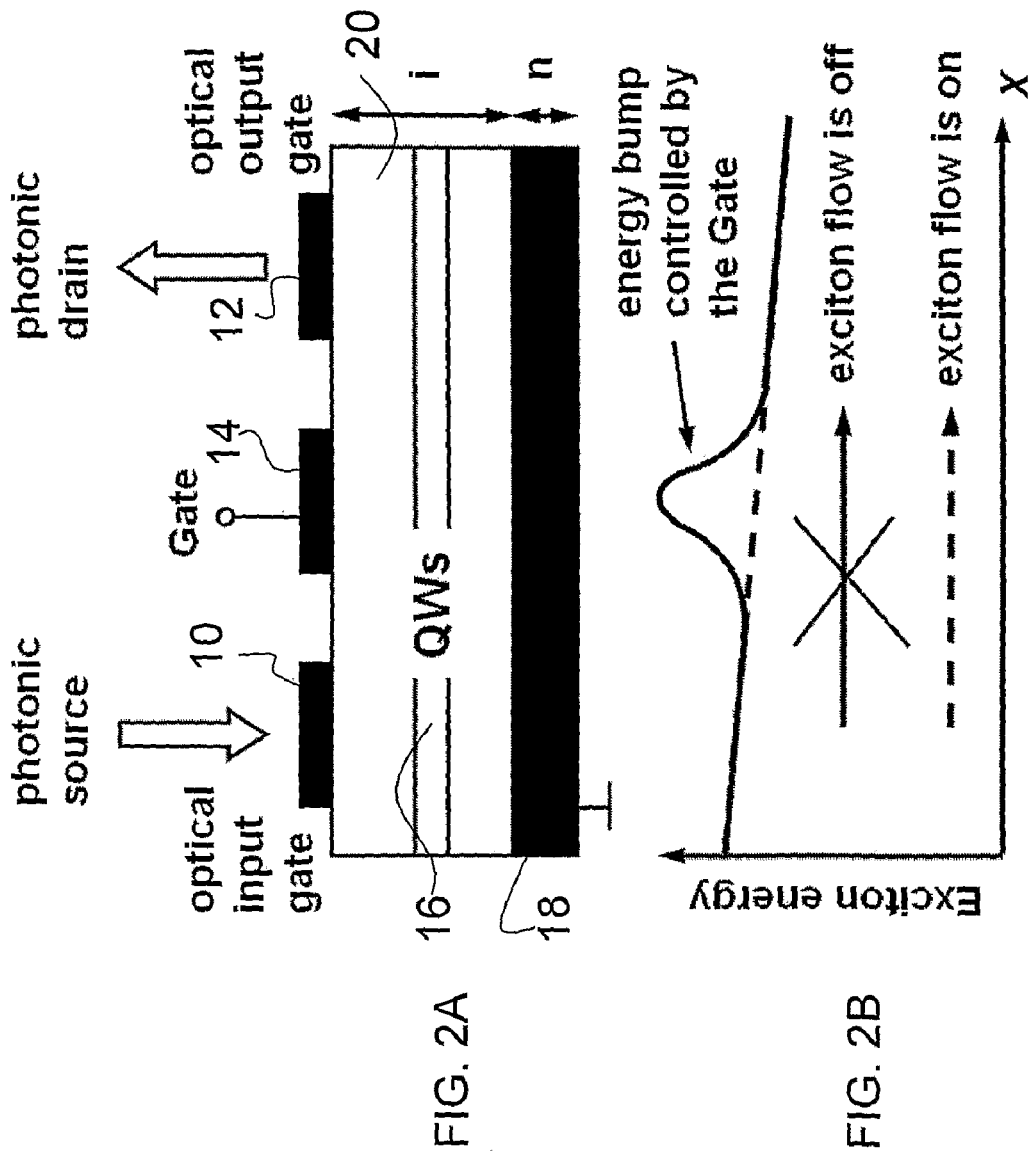
FIG. 2A illustrates a preferred embodiment of an exciton optoelectronic transistor.
FIG. 2B illustrates control of exciton flux via voltage in the FIG. 2A device.

The FIG. 1A-1E/FIG. 2A devices and integrated circuits of such devices can be operated to separately process holes and electrons. An applied electric field separates electrons and holes in different quantum wells (or on different sides of a single quantum well). The devices have similar structures as described in FIGS. 1A-1E and FIG. 2. To create electron and hole processing, the electrodes are controlled initially to separate electrons and holes.

Figure 4:
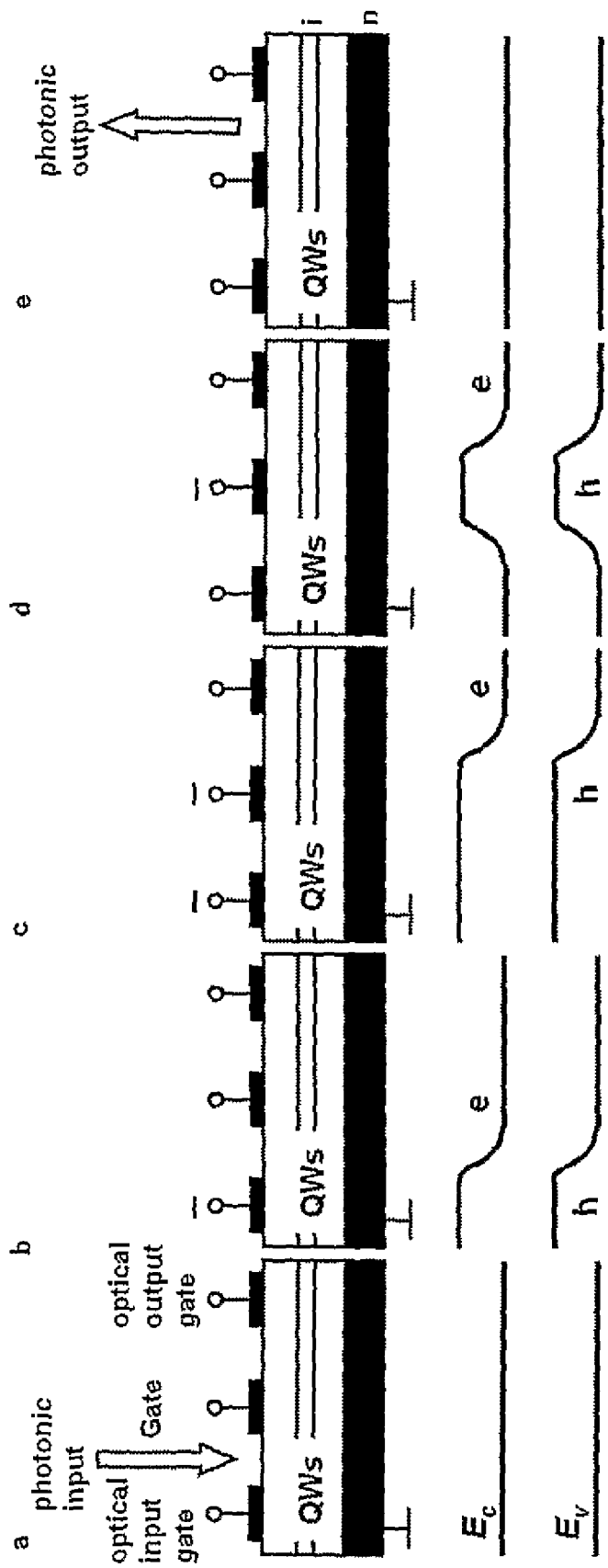
FIGS. 4A-4E illustrate an embodiment of separated electron and hole processing.

Electron-hole transistor operation will be described with respect to FIG. 2A and FIGS. 4A-4E. In FIG. 4A, electrons and holes are created at the optical input gate region between electrodes 10 and 14 by photon absorption. In FIG. 4B, application of voltage at the optical input gate electrode 10 separates electrons and holes in-plane. In FIG. 4C, voltage is applied to the control gate electrode 14, and moves the electrons and holes toward the region of the optical output gate electrode 12. In FIG. 4D, the voltage is changed, e.g., turned off, at the optical input gate, which moves holes further toward the region of the optical output gate electrode 12. In FIG. 4E, voltage is changed at the control gate electrode 14, which enables electrons and holes to meet at the optical output gate electrode region, which causes an emission of light from the region of the optical output gate electrode 12 due to electron-hole recombination.

A result of the electron and hole processing cycle of FIGS. 4A-4E is that the intensity of light emitted at optical output is proportional to the intensity of light at optical input and is controlled electronically by the gate electrodes. Transistor-like electronic operation on photons using electrons and holes as intermediate medium is accomplished.

Figure 5:
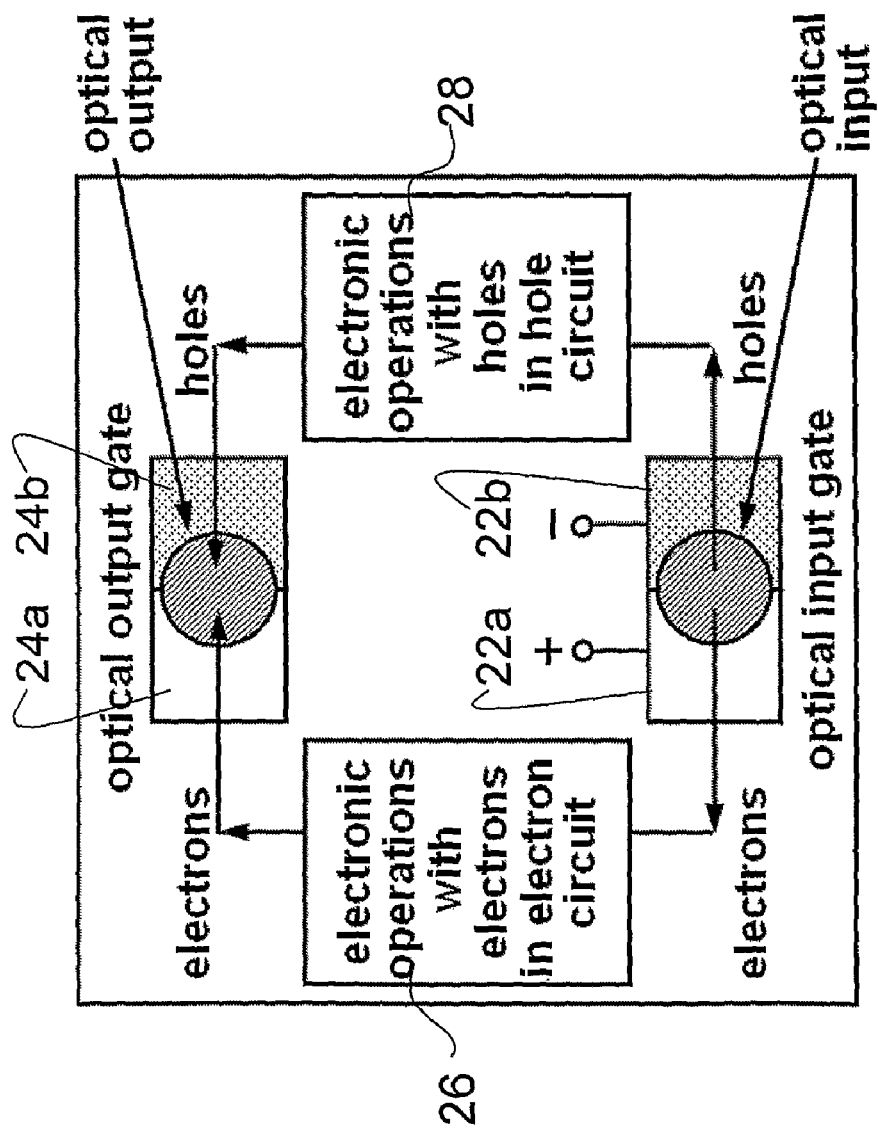
FIG. 5 illustrates an embodiment of integrated circuit device for separated electrons and holes.

In example integrated circuits for photon induced hole and electron processing and photon output, there is a separate hole and electron processing circuits, as illustrated in FIG. 5. In FIG. 5, electrons and holes are created at the region of the optical input gate electrode 22 by photon absorption. In this case, the optical input gate electrode 22 (and the optical output gate electrode 24) have separate positive and negative electrodes 22a, 22b, 24a, 24b. Voltage on the optical input gates separates electrons and holes in-plane of a chip under the positive and negative electrode, respectively. Electronic operations are performed separately with electrons in an electron circuit 26 in the chip and with holes in a hole circuit 28. Typical electronic devices can be used. Photon emission from region of the optical output gate electrode 24 is controlled by voltage on the optical output gates: varying the voltage, which controls the inplane separation of electrons and holes, enables them to recombine and emit light. The intensity of light emitted at optical output is proportional to intensity of light at optical input and is controlled electronically by gates in the electron and hole circuits.

The exciton, electron and hole circuits may be connected to many optical inputs and outputs and other circuits in a complex integrated optoelectronic circuit. Devices of the invention are scalable and form monolithically integrated optoelectronic circuits.

Processing with Electron and Hole Spins

Electron and hole spins also have the potential for signal processing. Spin devices have potential advantages in speed, dissipation, and size over conventional charge devices. The coupled or wide quantum well structures with localized control gate electrodes of FIGS. 1-5 can also be used for signal processing which utilizes the spin degree of freedom in optoelectronic devices.

Operation of the FIGS. 1A-5 devices can take advantage of the spin degree of freedom. In a basic optoelectronic material, e.g., GaAs, there are two optically active types of electron-hole pairs: one of them has the electron and hole spins (e+1/2,h−3/2) and emits/absorbs left-hand circularly polarized light and another pair has spins (e−1/2,h+3/2) and emits/absorbs right-hand circularly polarized light [the pairs with (e+1/2,h+3/2) and (e−1/2,h−3/2) are optically inactive]. The time of exciton spin flip between optically active spin states is determined by the overlap between the electron and hole wave functions. In coupled quantum well structures the overlap between the electron and hole wave functions can be controlled electronically, e.g. in coupled quantum well structures studied in Butov et al., "Photoluminescence Kinetics of Indirect Excitons in GaAs/AlGaAs Coupled Quantum Wells,"Phys. Rev. B 59, 1625 (1999) control of the overlap between the electron and hole wave functions resulted to change of the exciton emission rate by about $10^4$ times, as discussed above, by a moderate gate voltage V<1.6 V. Therefore, the coupled quantum well devices with localized control gates of the invention give an opportunity for electronic control of the time of exciton spin flip between optically active spin states within about eight orders of magnitude. This property is utilized in the invention for spin-opto-electronic signal processing.

General operation principles of exemplary embodiment devices of the invention include a number of steps. A first step includes converting polarized photons into spatially separated spin-polarized electrons and holes. Another step includes performing electronic operations with spin-polarized electrons and holes. After electronic operations, spin-polarized electrons and holes are converted into polarized photons. A result of operation of the exemplary embodiment device is that the polarization of light emitted at optical output is proportional to polarization of light at optical input and is controlled electronically by gates. The device implements electronic operation on photon polarization using electron spins as intermediate medium. Example operations include switching, modulation, logical operations, etc.

With reference to FIG. 2A, in a preferred embodiment of excitonic spin transistor, spin-polarized excitons can be created by circularly polarized light in the region of the input gate electrode 10. The circularly polarized light can be, for example, an input signal from the output of another spin-optoelectronic-transistor. Spin-polarized excitons can also arrive to the input from the output of another device via transport. Operation then proceeds as before, with the spin-polarized excitons traveling to the optical output gate electrode 12 with the control gate electrode 14 controlling the spin flow by controlling the exciton energy and the time of exciton spin flip between optically active spin states thus realizing on or off state of the excitocic spin transistor. The time of exciton spin flip between optically active spin states is long due to electron-hole separation. A voltage pulse can be applied to the optical output gate electrode 12 increasing the exciton recombination rate thus facilitating conversion of the exciton spin state to the photon polarization resulting to optical readout of the exciton spin state at the optical output.

Using polarized light input in the other processes and integrated devices described above also produces spin control devices and operations. The long lifetimes and spin relaxation times of the indirect excitons allows transferring spin polarization over the device from optical input to optical output. A short spin relaxation time for holes does not reduce degree of the photon polarization at the optical output since excitons (for example in GaAs) become optically inactive after hole spin-flip. (Indeed, for an optically active pair (e+1/2,h−3/2) created at optical input, after the hole spin relaxation, the pair (e+1/2,h+3/2) becomes optically inactive and does not emit a photon at the photonic output.)

While specific embodiments of the present invention have been shown and described, it should be understood that other modifications, substitutions and alternatives are apparent to one of ordinary skill in the art. Such modifications, substitutions and alternatives can be made without departing from the spirit and scope of the invention, which should be determined from the appended claims.

Various features of the invention are set forth in the appended claims.

The invention claimed is:

1. An optically interfaced electrically controlled device, comprising:
    photonically responsive intrinsic semiconductor material upon a substrate;
    an intrinsic quantum well structure disposed within said photonically responsive intrinsic semiconductor material, the intrinsic quantum well structure being dimensioned, arranged and formed from materials that create excitons having a nonzero distance d between a separated electron and hole;
    an input gate electrode disposed over an input region of said photonically responsive intrinsic semiconductor material and said intrinsic quantum well structure;
    an output gate electrode disposed over an output region of said photonically responsive intrinsic semiconductor material and said intrinsic quantum well structure; and
    a localized control gate electrode disposed over a control gate electrode region of said photonically responsive intrinsic semiconductor material to control exciton flow between said input region and said output region.

2. The device of claim 1, wherein said intrinsic quantum well structure comprises two quantum well layers separated by an intrinsic barrier layer structured such that an exciton formed in said two quantum well layers comprises an electron in one of the two quantum well layers and a hole in the other of the two quantum well layers.

3. The device of claim 2, wherein said intrinsic quantum well structure comprises two quantum well layers of different intrinsic materials.

4. The device of claim 1, wherein said intrinsic quantum well structure comprises a wide single quantum well that create a nonzero distance d between a separated electron and hole that comprise an exciton.

5. The device of claim 1, wherein each of said control, input and output gate electrodes are biased relative to the substrate electrode so that exciton fluxes can be controlled.

6. The device of claim 4, further comprising separate hole and electron processing circuits.

7. An integrated electro optical circuit including a plurality of devices according to claim 1.

8. A method of excitonic signal processing with a device according to claim 1, the method comprising steps of:
    creating excitons in said input region with a voltage applied to said input gate electrode;
    controlling exciton flow to said output region with voltage applied to said control gate electrode; and
    converting excitons to photons in said output region by application of a voltage pulse to said output gate electrode.

9. The method of claim 8, wherein said step of creating comprises producing spin polarized excitons with polarized light, said step of controlling exciton flow comprises controlling flow of spin polarized excitons, and said step of converting excitons to photons comprises converting of spin polarized excitons to polarized photons.

10. A method of separately processing holes and electrons with a device according to claim 1, the method comprising steps of:
    photo-exciting electrons and holes at the input region with a voltage applied to said input gate electrode;
    moving electrons and holes toward the output region with voltage applied to the control gate electrode;
    moving holes further toward the output region by changing voltage on the input gate electrode;
    permitting electrons and holes to meet and convert to photons in the output region by changing voltage on the control gate electrode.

11. The method of claim 10, wherein said step of photo-exciting comprises producing spin polarized electrons and holes with polarized light, said step of moving electrons comprises moving spin polarized electrons, and said step of permitting electrons and holes to meet and convert to photons comprises permitting spin polarized electrons and holes to meet and convert to polarized photons.

12. The device of claim 1, wherein said input gate electrode and said output gate electrode comprise substantially transparent conductors.

13. The device of claim 1, wherein said substrate comprises a conducting substrate.

14. The device of claim 2, further comprising separate hole and electron processing circuits.

15. The device of claim 3, further comprising separate hole and electron processing circuits.

* * * * *

UNITED STATES PATENT AND TRADEMARK OFFICE
CERTIFICATE OF CORRECTION

PATENT NO. : 7,825,402 B2
APPLICATION NO. : 12/293909
DATED : November 2, 2010
INVENTOR(S) : Butov It is certified that error appears in the above-identified patent and that said Letters Patent is hereby corrected as shown below:

In the Specification:

| | |
|---|---|
| Col. 1, Line 44 | After "it is," please delete the ",". |
| Col. 4, Line 1 | Before "the device" please insert --the output of--. |
| Col. 4, Line 2 | After "conversion" please insert --of--. |
| Col. 4, Line 28 | Please delete "pair(s)" and insert --pairs-- in its place. |

Signed and Sealed this
Twenty-sixth Day of April, 2011

David J. Kappos
*Director of the United States Patent and Trademark Office*